United States Patent [19]

Taoka et al.

[11] 4,186,305
[45] Jan. 29, 1980

[54] HIGH-TEMPERATURE MICROSCOPE

[75] Inventors: Tadami Taoka, Masashino; Fumio Nakajima; Hisashki Kawamura, both of Tokyo; Yutaka Hirano, Narashino; Kimio Maru, Chafu; Kazutoshi Arita, Itabashi; Hidemasa Yoshida, Tokyo, all of Japan

[73] Assignee: Union Kogaku Kabushiki Kaisha, Tokyo, Japan

[21] Appl. No.: 882,895

[22] Filed: Mar. 1, 1978

[51] Int. Cl.² .......................................... G01M 23/00
[52] U.S. Cl. ..................................... 250/311; 250/443
[58] Field of Search ................... 250/311, 350, 356 R, 250/397, 398, 440, 442, 443; 313/11, 13; 219/121 EB, 121 EM

[56] References Cited

U.S. PATENT DOCUMENTS

| | | | |
|---|---|---|---|
| 3,514,595 | 5/1970 | Schwarz et al. | 250/311 |
| 4,115,802 | 9/1978 | Kramer | 250/311 |

OTHER PUBLICATIONS

"Temperature Control of Metallic Target, in Vacuo by Electron Beam and IR Radiometry Tech.", Lewis et al, Review of Scie. Inst., vol 40, No. 5, May 69, pp. 698-702, class 250-443.

Primary Examiner—Bruce C. Anderson
Attorney, Agent, or Firm—Wenderoth, Lind & Ponack

[57] ABSTRACT

The present invention relates to a high-temperature microscope. According to this invention, a specimen is held in vacuum with one side of it heated through exposure to an electron beam and the other side of it observed through an observation window.

A curtain of inert gas is formed between the specimen and the observation window to prevent the window from being clouded, i.e., to prevent vapor deposit on the window from the specimen.

Visual observation (including photography) and measurement of the specimen temperature by heat radiation therefrom are done individually with different bands of wavelengths. For the purpose of illuminating the specimen, beams of spectral distribution containing the components of in the visible band for observation are used but no components of the temperature-measuring band are utilized as light source. For the purpose of visual observation, a narrow visible band contained in the aforesaid beam located in low brightness in the heat radiation beams from the specimen is utilized.

9 Claims, 19 Drawing Figures

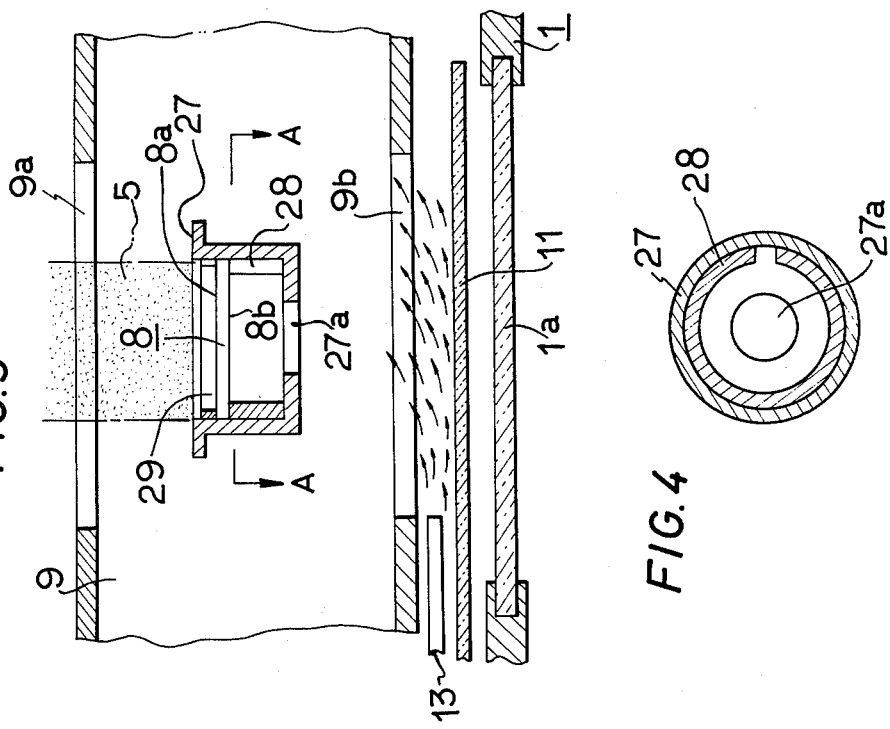
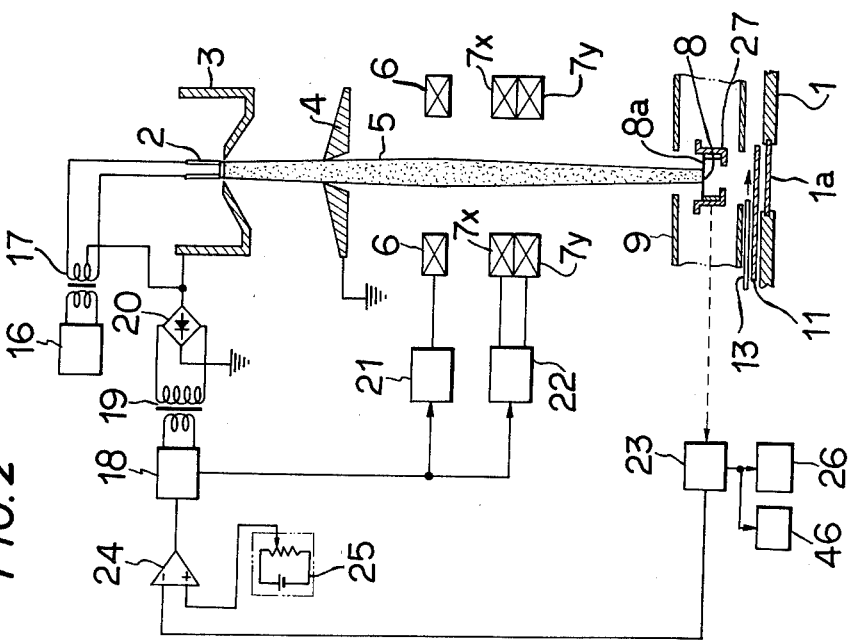

RELATIVE SPECTRAL RADIANCY FOR ILLUMINATING AND RADIATION BEAM.

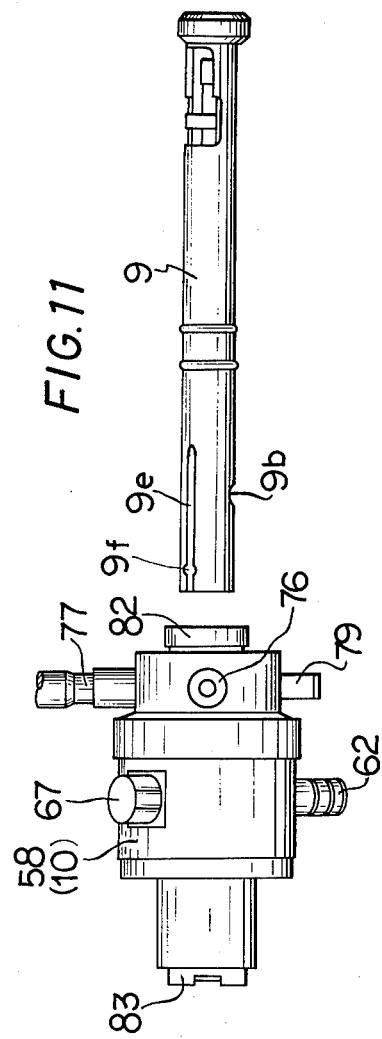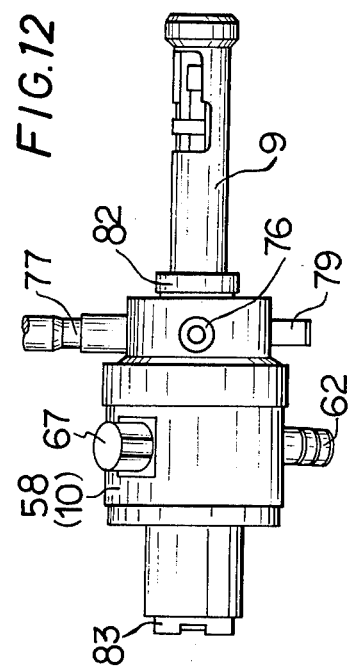

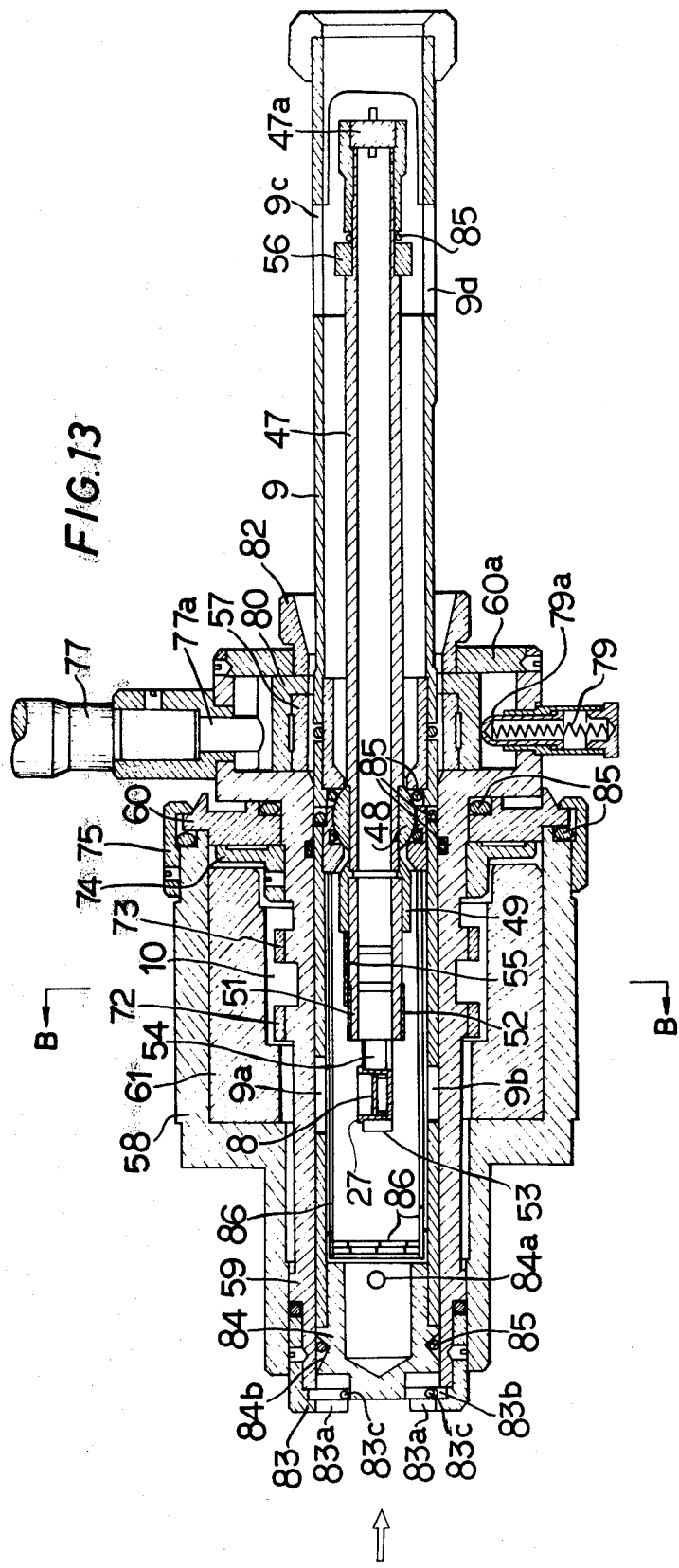

HIGH-TEMPERATURE MICROSCOPE

BACKGROUND OF THE INVENTION

The high-temperature microscope is intended for observing the structure of a specimen which is heated to higher than room temperature and for investigating the structural changes in a specimen which is heated to high temperature or cooled to room temperature from high temperature.

Conventionally the specimen used to be held in a radiation heating furnace and was indirectly heated by radiation heat from a heating element attached internally around the furnace or was directly heated by passing electric current through it when it was a metal.

When the specimen is heated in such a conventional furnace for high temperature metallography, the maximum heat attainable is 1700° C., because of the limit in the heat durability of the refractory materials used in the furnace. When a furnace is used, the heat capacity of the furnace is so large that the heat loss is heavy; and since the heat transfer is slow, the response is not quick.

When the specimen is directly heated by passing electric current through it, the specimen must be a thin strip conductor. The maximum temperature attainable is limitted by the specimen shape and the temperature distribution is not even.

In any of the conventional methods, only a simple, overall heating of the specimen is possible.

To prevent oxidation, the specimen is heated in a vacuum, and much gas is generated not only from the specimen but also from the refractory materials which is vaporized. Then, the specimen is contaminated with the vapor or it reacts with the vapor, thus impeding accurate observation. Further, the vapor deposits on any low-temperature part, notably on the observation window, thereby clouding the glass and inconveniencing observation and photography.

In the conventional method, observation and photography of the specimen are done utilizing a mixture of reflection from the beam which illuminates the specimen and heat radiation from the specimen exposed to high temperature. Thus for the following reasons, there is a limitation to the high temperature of the specimen under which it can be observed or photographed.

Namely, when the specimen temperature is high, heat radiates from the specimen, but the radiation beam contains visible rays as well as invisible ones. The visible rays mix with the reflection of the beam which illuminates the specimen and in consequence, the image of the specimen to be observed or photographed is flared and blurred with reduced contrast.

Since the brightness of radiation beam increases with a rise in the specimen temperature, the proportion of radiation beams in the visible rays grows and accordingly the influence of the interfering rays becomes that much greater.

Therefore, there is naturally a limit to the high temperature of the specimen which permits its observation and photography.

Meanwhile, it is common practice in measuring the specimen temperature to use a thermocouple directly attached to the specimen by, say, welding. However, such a measuring apparatus cannot accurately measure the temperature on the observed surface of the specimen.

The temperature distribution of the specimen as a whole is not always uniform and the temperature indicated by the thermocouple is the temperature of the specimen portion with which the thermocouple is in contact and not the temperature of the other specimen portion observed which is separated from the contact with the thermocouple. Thus the thermocouple is not an accurate device for measuring the temperature of the observed portion of the specimen.

Particularly when the specimen is thin with a low heat capacity, the heat transfer from the thermocouple to the specimen becomes too much to be neglected; when the specimen is heated or its temperature drops from high to normal, and the temperature distribution of the specimen becomes inordinately uneven with the result that the measured value of temperature is extremely inaccurate.

For these reasons a heating device has been demanded which can heat the specimen to higher temperature, is quick in response, is highly efficient, and heats only the specimen without affecting anything around it. The device should be one that can do a variety of heatings; not only simple, overall heating of the specimen, but also localized heating of it. The device should be one that will not cloud the observation window or least is not likely to cloud it. The device should be one which permits observing or photographing a clear image of the specimen without being influenced by heat radiation beam, and it should accurately measure the specimen temperature even when the specimen is hot.

SUMMARY OF THE INVENTION

The primary object of the present invention is to provide a high-temperature microscope which can heat a specimen made of metal such as tungsten, tantalum, molybdenum and copper or non-metal such as ceramics to higher temperatures than is possible in the conventional microscope.

Another object of the present invention is to provide a high-temperature microscope characterized by quick response in heating the specimen and high efficiency of heating without affecting anything other than the specimen.

Still another object of the present invention is to provide a high-temperature microscope which can perform a variety of heatings including a localized heating of the specimen.

Still another object of the invention is to provide a high-temperature microscope which has an observation window which is free from clouding or which least is unlikely to be clouded even when the specimen is hot.

Still another object of the invention is to provide a high-temperature microscope that permits a clear image of the specimen to be observed or photographed without being influenced by a heat radiation beam even when the specimen is hot.

Still another object of the invention is to provide a high-temperature microscope that can accurately measure the temperature of the observed portion of the specimen under observation.

BRIEF DESCRIPTION OF THE DRAWINGS

The high-temperature microscope according to the present invention will become more apparent by reading the following detailed description of the invention with reference to the attached drawings.

These drawings are only illustrative and are not intended to be restrictive of the scope of the present invention;

FIG. 2 is a block diagram illustrating the electron beam heater.

FIG. 3 is a vertical section view of the specimen dish and the inert gas inlet;

FIG. 4 is an A—A section view of the specimen dish in FIG. 3;

FIGS. 11 to 18 illustrate the specimen-holder;

FIG. 11 is a partial side view of the invented device in a state before insertion of the specimen-holding tube;

FIG. 12 is a partial side view of the device in a pre-exhausted state.

FIG. 13 is a partial vertical section view of the device with the air lock plug unlocked after pre-exhaustion.

FIG. 14 is a view along the line B—B of FIG. 13;

FIG. 15 is a diagram illustrating the relation, as viewed from the arrow direction in FIG. 13, of the airlock plug and plug bearing;

FIG. 16 is a partial horizontal longitudinal section view of said device in a state after insertion of the specimen-hold tube;

FIG. 17 is a partial C—C section view of FIG. 16;

FIGS. 18 (A) and 18 (B) are an oblique view of the specimen holding part and a dismantled view of the principal parts of the specimen holding part, respectively.

DETAILED DESCRIPTION OF THE INVENTION

Figure 1:
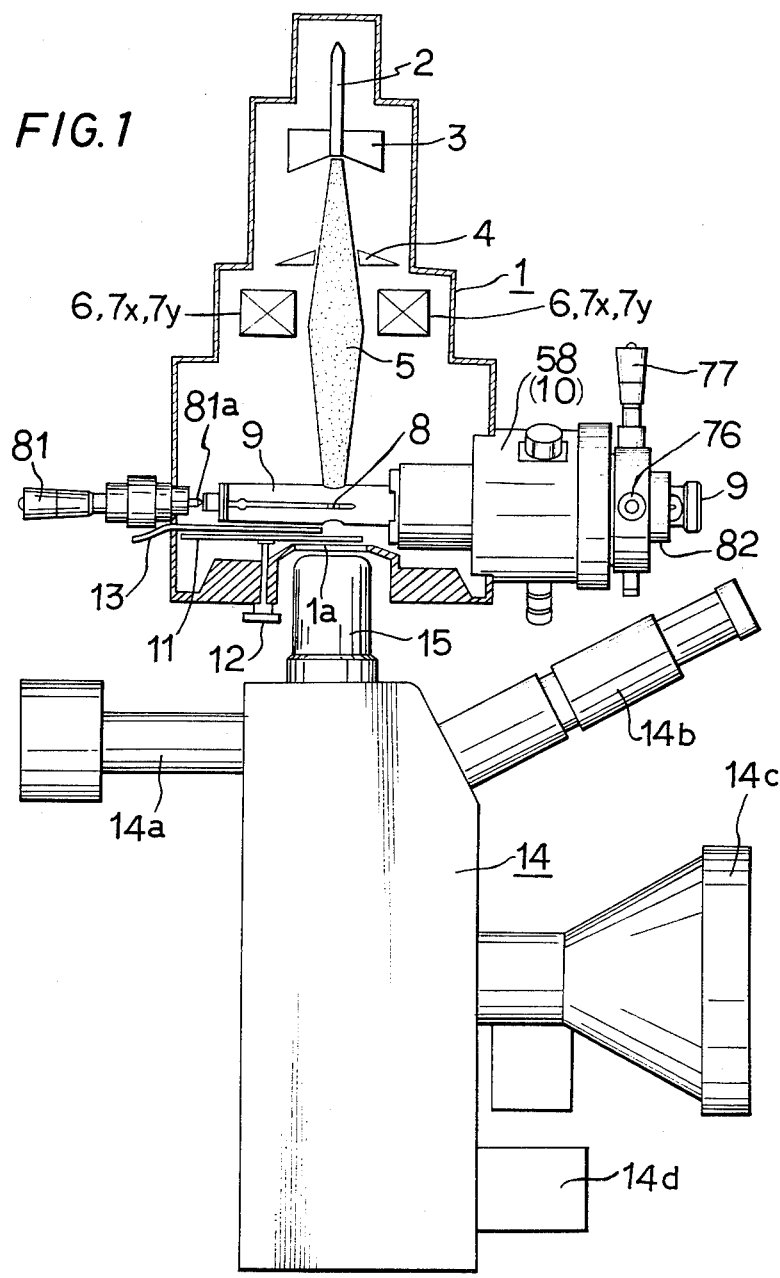
FIG. 1 is a partially sectional side view of the invented device as a whole.

Referring to the drawings, one embodiment of the present invention is to be described. In the drawings, like symbols denote like parts. In FIG. 1, a vacuum tank 1 made of corrosion resistant metal, such as stainless steel, consists of a sealed chamber equipped at mid-bottom with an observation window 1a of clear quartz glass.

This tank 1 is connected to an exhausting device (not shown) to evacuate the tank 1, and thanks to this device the tank 1 can be always be maintained at a specified vacuum.

At the top of the tank 1 is a known pierce-type electron gun with a cathode 2, a wehnelt 3 and an anode 4. A focusing coil 6 and deflecting coils 7x, 7y of the electron beam control are arranged along the path of the electron beam 5 from the electron gun.

As indicated in FIGS. 2 and 3, the specimen 8 is held within a specimen-holding tube 9; and the top surface 8a of the specimen 8 is exposed to the electron beam 5, while its under surface 8b is observed through the observation window 1a.

Adjacent the tank 1 is a pre-exhaustion chamber 10 through which the specimen-holding tube 9 passes as it goes into or out of the tank 1. The pre-exhaustion chamber 10 is also connected to the exhausting device (not shown).

A rotatable disk window 11 of clear quartz glass, located between the specimen 8 and the observation window 1a can be rotated by turning the switch handle 12 to thereby change the portion thereof located between the specimen 8 and the observation window 1a between the disk window 11 and the tube 9, a nozzle of an inert gas inlet pipe 13 opens.

Below the vacuum tank 1 is an optical system housing 14 which houses the optical devices for illumination, observation, photography and temperature measurement. The unit 14a houses the illuminating device, the unit 14b houses the observation device, the unit 14c houses the photographic device, and the unit 14d houses a temperature measuring device.

An objective lens 15 is located just below the observation window 1a.

Now referring to FIGS. 2 to 4, the electron beam control, the electron gun and the inert gas inlet device will to be described.

In FIG. 2, the cathode 2, wehnelt 3 and anode 4 constitute a well-known pierce-type gun. The cathode 2 is connected via a transformer 17 to the output side of the filament heating source 16.

The wehnelt 3 is connected via a step-up transformer 19 and a rectifier 20 to the output side of a variable high tension source 18.

The variable high tension source 18 is, as described later, one whose output voltage can be changed by the output from a differential amplifier 24 connected thereto.

Only the negative output of the rectifier 20 is connected to the wehnelt 3 and the positive output is grounded. Therefore the wehnelt 3 is supplied with a negative voltage. The anode 4 is grounded.

Meanwhile, the negative output side of the rectifier 20 is connected to the secondary neutral tap of the transformer 17 and the wehnelt 3 is held at nearly the same potential as the cathode 2. Thus, a high electron-beam accelerating voltage is applied between the cathode 2 and the anode 4, and from the heated tip of the cathode 2, thermionic electrons are emitted which form axisymmetric, parallel electron beams 5.

As mentioned above, the focusing coil 6 and the deflecting coils 7x, 7y are arranged along the path of the electron beams 5.

The focusing coil 6 focuses the electron beams 5 which diverge after passing through the anode 4. The focusing coil is connected to the output side of a focusing coil exciting source 21 and receives the output current thereof.

The deflecting coils 7x, 7y control the direction of the electron beams 5 respectively in the X-axis and Y-axis directions. The deflecting coils are connected to the output side of a deflecting current generator 22 and function by receiving, respectively, output currents in the X-axis and Y-axis directions.

The intensity of the focusing action of the focusing coil 6 and the deflecting sensitivity of the deffecting coils 7x, 7y are generally proportional to the square root of the electron beam acceleration voltage.

The focusing coil exciting source 21 and the deflecting current generator 22 are to be manually variable so that the output current can be set at a specific value.

The exciting source 21 and the current generator 22 are connected to the variable high tension source 18 and receive its output, i.e., an electron beam accelerating voltage, and are designed so that their outputs can be automatically adjusted in proportion to the square root of the electron beam. Thus, the focusing intensity and the deflection sensitivity can be held constant when the electron beam accelerating voltage changes.

The electron beam 5 is controllable by the focusing coil 6 and the deflecting coils 7x, 7y. The electron beam bombards the exposed surface 8a of the specimen from a fixed position or traverses over it. The specimen 8 is heated by bombardment with this electron beam 5.

The density distribution of the electron beams 5 near the specimen 8 is a so-called crater type, i.e., sparse at the center and dense at the periphery. This means that the periphery is more strongly heated than the center, and with the heat loss from the exposed surface 8a of the specimen from the periphery being compensated, the whole exposed surface 8a has a uniform temperature distribution.

The temperature of the heated specimen 8 is measured by an infrared radiation pyrometer 23 which will be described later. This pyrometer 23 is connected to the input side of the differential amplifier 24. The measured output from the pyrometer goes as a D-C voltage proportional to the temperature into the differential amplifier 24.

A temperature setter 25 presets a temperature to which the specimen 8 is to be heated.

The setter 25 can set a lasting constant temperature or can program a setting which will automatically change temperature.

The setter 25 can always generate a D-C voltage of the same magnitude as the output of the infrared radiation pyrometer 23 given at a temperature preset by the setter.

Also, setter 25 is connected to the input side of the differential amplifier 24 and generates a D-C output equivalent to the preset temperature.

The differential amplifier 24, by comparing the output voltage of the infrared radiation pyrometer 23 and that of the temperature setter 25, generates an output of polarity and level corresponding to the difference. The output of the amplifier 24 causes a change in the output voltage of the variable high tension source 18, a change in the potential difference between the cathode 2 and the wehnelt 3 on one part and the anode 4 on the other, and accordingly, a change in the radiation of electron beam 5.

To be more specific, when the output voltage of the infrared radiation pyrometer 23 is lower than the output voltage of the temperature setter 25, the potentials of the cathode 2 and the wehnelt 3 are raised to widen the potential difference from the anode 4, thereby increasing the velocity and density of the electron beams 5.

When the output voltage of the infrared radiation pyrometer 23 is higher than the output voltage of the temperature setter 25 (contrary to the above); the potential difference is narrowed to decrease the velocity and density of the electron beams 5.

The potential difference is adjusted in accordance with the output voltage difference between the infrared radiation pyrometer 23 and the temperature setter 25. Namely, when there is a wide difference in the output voltage between the pyrometer 23 and the setter 25, the potential difference is largely increased or decreased to cause a large change in the radiation of the electron beams 5 and a sudden change in the temperature of the specimen 8.

As the specimen temperature comes close to the preset value and the gap between the output voltage of the pyrometer 23 and that of the setter 25 narrows, the largely increased or decreased potential difference is slowly readjusted to lessen the increment or the decrement.

When the specimen temperature agrees with the preset value and the difference in the output voltage vanishes, the potential difference between the cathode 2, wehnelt 3 and anode 4 in that state is maintained and the specimen 8 is thus held at the preset temperature.

Meanwhile a pen-recorder 26 connected to the pyrometer 23 receives its output and records the specimen temperature, and a temperature indicator 46 renders the output of the pyrometer 23 visible.

As shown in FIGS. 3 and 4, the specimen 8 is made in the form of a disk or a rectangle with a diameter smaller than the inner diameter of a specimen dish 27. The specimen 8 is mounted on a specimen seat 28 of the specimen dish 27 and its top is fixed with a ring spring 29.

The specimen dish 27 consists of a bottomed cylinder with a flanged edge around the top and an observation opening 27a at mid-bottom. The specimen seat 28 consists of a C-shaped cylinder with an outer diameter slightly smaller than the inner diameter of the specimen dish 27 and has a partial notch on the periphery.

The specimen seat 28 is first inserted into the specimen dish 27; next the specimen 8 is placed on the seat 28; and then the top is clamped with the ring spring 29.

As will be described later, the specimen dish 27 is supported within the specimen-holding tube 9.

In the specimen-holding tube 9, the electron beam inlet 9a is provided at a position above the specimen dish 27 and the observation hole 9b is below the dish 27.

Electron beams 5 hit the exposed surface 8a of the specimen 8 through the inlet 9a, while the opposite surface 8b of the specimen is observed through the observation hole 9b.

Between the observation window 1a of the vacuum tank 1 and the observation hole 9b of the specimen-holding tube 9 there is the rotatable window 11, and between this window 11 and the observation hole 9b the nozzle of the inert gas inlet pipe 13 is positioned.

The inert gas inlet pipe 13 is a very fine tube made of stainless steel as fine as an injection syringe needle.

As indicated in FIG. 1, the pipe 13 runs through the wall of the tank 1, and the gas-eject direction crosses the observing direction at right angles.

The pipe 13 introduces and ejects a high-purity inert gas, such as argon or nitrogen, as a continuous, fine flow and thus a gaseous space of specific pressure is continuously formed between the observation window 1a and the observation hole 9b, and more specifically, between the rotatable window 11 and the observation hole 9b.

This gaseous space constitutes a gas curtain between the specimen 8 and the observation window 1a.

The arrows in FIG. 3 indicates a flow of inert gas.

The specimen dish 27 and the specimen seat 28 or thin-walled pipe 52, clamp plates 53, chevron piece 54 and lead plate 55 (see FIG. 13) which come into contact with the hot specimen 8 or the located near the specimen 8 are made of metals or non-metals, with high melting points, such as tungsten, tantalum, thoria, zirconia, alumina, according to the applications.

In the system thus constituted of the electron gun, the electron beam control and the inert gas inlet, the electron beams emitted from the cathode 2 go through the anode 4, are focused by the focusing coil 6, and are then deflected by the deflecting coils 7x, 7y.

Focusing and deflection are adequately done by manually adjusting the output voltage of the focusing coil exciting source 21 and the X- and Y-direction output currents of the deflection current generator 22. The degrees of focusing and deflection can be maintained constant regardless of change in the electron beam accelerating voltage.

Therefore, the electron beam-exposed area and position of the specimen 8 can be freely selected. For instance, the specimen may be linearly heated by scanning with electron beams 5.

The specimen temperature is detected by the infrared radiation pyrometer 23 and the detected value is compared with a value preset by the temperature setter 25 in the differential amplifier 24. Depending on the difference in this comparison, the output voltage of the variable high tension source 18 changes automatically; the potential difference between the anode 4 and cathode 2 and wehnelt 3 changes accordingly; and thus, with the characteristic of the electron beam 5 changed, the specimen temperature is adjusted to agree with the preset value given by the temperature setter 25.

At the same time, the inert gas continuously introduced and ejected between the observation hole 9b of the specimen-holding tube 9 and the rotatable window 11 forms a locally pressurized gaseous space, and the continuous diffusion of the inert gas within the tank 1 yields a gas curtain which contributes to the mitigation of clouding of the rotatable window 11.

FIGS. 5 to 8 illustrate the heating characteristics of the system.

Figure 5:
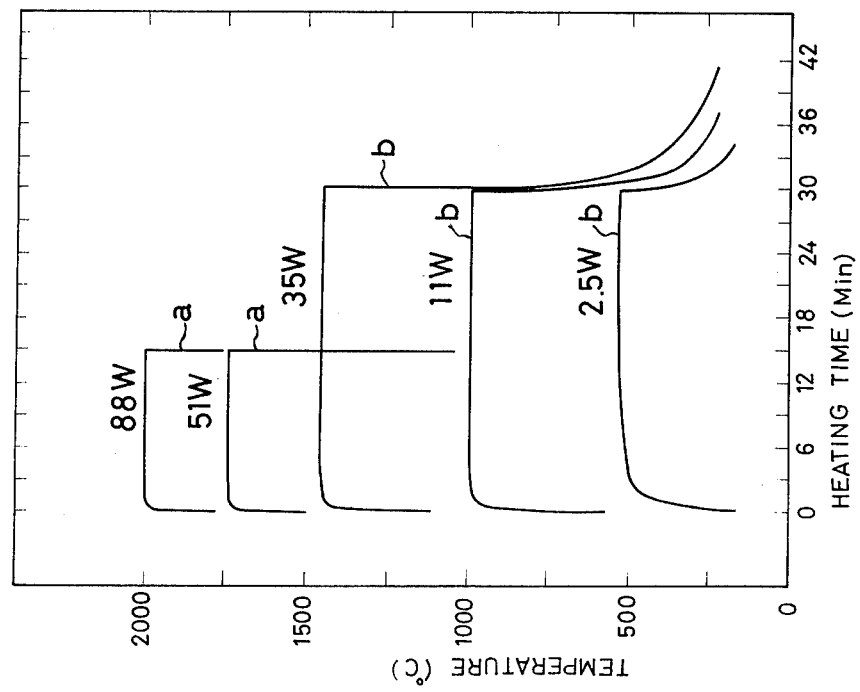

FIG. 5 shows the characteristic when the specimen is heated in vacuum by electron beam output of magnitudes respectively indicated, "a" being the case of using a tungsten plate 5.6 mm long and wide and 0.3 mm thick and "b" the case of using a tantalum disk 8 mm in diameter and 1 mm thick, as the specimen 8.

Figure 6:
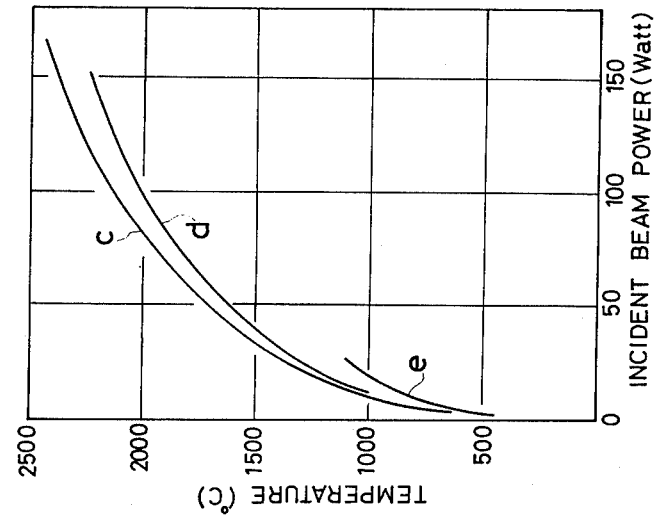
FIGS. 5 to 8 illustrate the heating characteristics, (, e.g.) FIG. 5 being a heating time vs. temperature curve, FIG. 6 being an incident beam power vs. temperature curve and FIGS. 7, 8 being programmed control diagrams.

FIG. 6 indicates the specimen temperature when the electron beam output is increased, "c" being the case of using a molybdenum plate 5.6 mm long and wide and 0.5 mm thick, "d" the case of using a tantalum disk 8 mm in diameter and 1 mm thick, and "e" the case of using a copper disk 8 mm in diameter and 1 mm thick, as the specimen 8.

Figure 8:
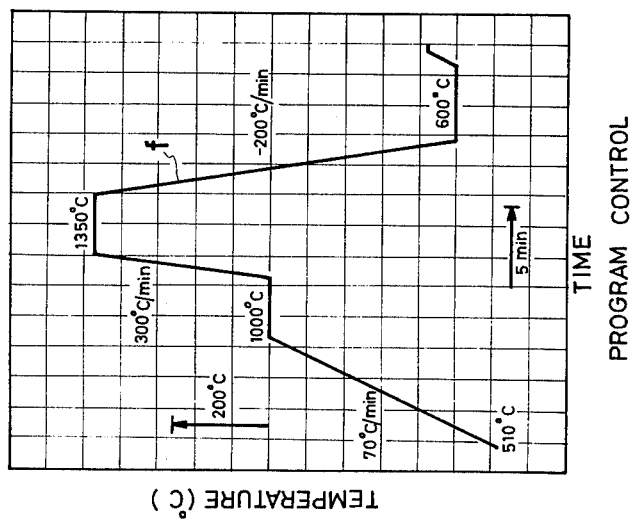
Figure 7:
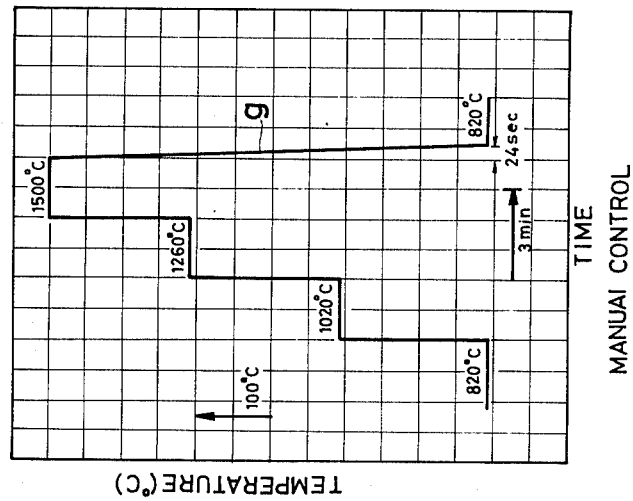

FIGS. 7 and 8 show examples of programmed control of the specimen temperature, "f" and "g" being the case using a tantalum disk 8 mm in diameter and 1 mm thick as the specimen 8.

Next the optical system is to be described.

Figure 9:
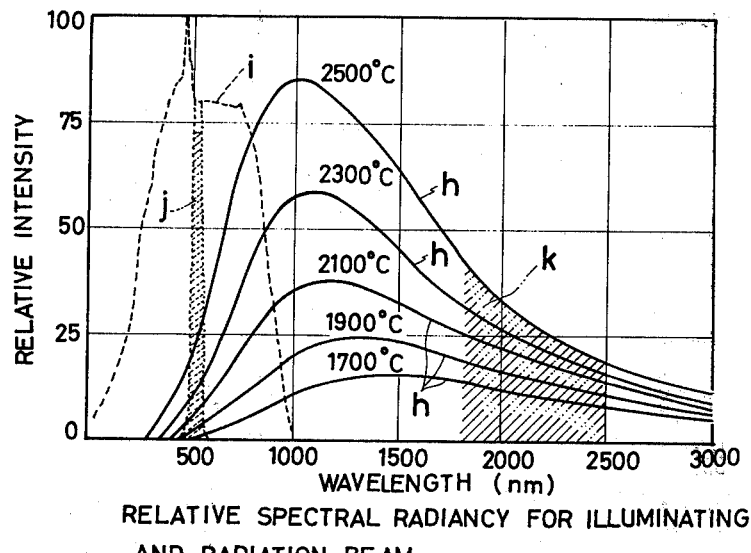
FIG. 9 is a wavelength characteristic diagram illustrating the principle of observation, photography and temperature measurement.

FIG. 9 illustrates a spectral distribution characteristic, "h" indicating a black-body radiation, i.e., heat radiation beam. This characteristic is universal regardless of the material quality. As is evident from this characteristic diagram, the heat radiation beam "h", at whatever temperature, is of such a pattern that the brightness is high in the infrared range of short waves and low in the visible and infrared ranges of long waves.

Therefore accurate observation and temperature measurement are possible by separating the band for visual observation (including photography) from the band for temperature measurement. Thus, in visual observation of a specimen under the high-temperature microscope, if a band with low brightness of the heat radiation beam "h" in the visible range is utilized, the adverse effect of the heat radiation beam "h" increasing with a rise in the specimen temperature can be lessened.

Notably, if the specimen is exposed to beams containing components of the band in the visible range so that the brightness of the heat radiation beam "h" can be low as compared with the brightness of the illuminating beam, the adverse effect of infiltration of heat radiation beams "h" in the specimen observation can be further lessened.

If at the same time the temperature is measured in a band containing heat radiation beams "h" and separated from the band used for visual observation so that the components of the band used for temperature measurement may not be included in the illuminating beams and thus the reflection from the illuminating beams may not infiltrate into the heat radiation beams "h" of the band for temperature measurement, the temperature of the specimen will be accurately measured.

In the following account, the visual observation band thus selected is designated as the first band and the band for temperature measurement as the second band.

The first band is one in the visible range in which the brightness of the heat radiation beam "h" is low, while the second band is one with heat radiation beams "h" present therein which does not duplicate the first band.

Figure 10:
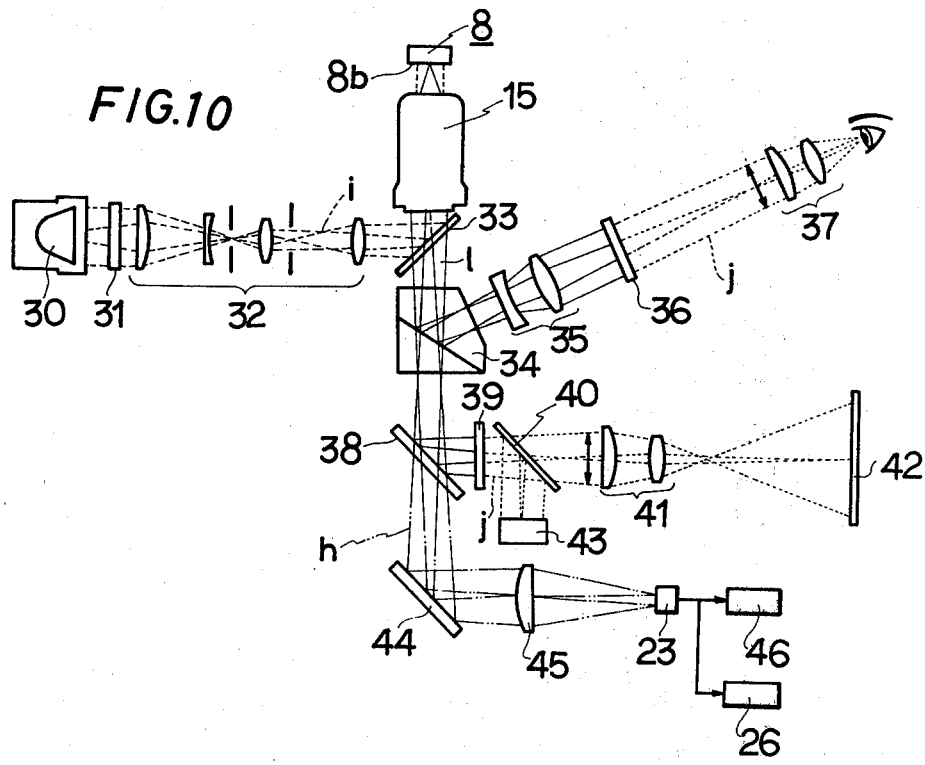
FIG. 10 shows the constitution of the optical system.

In FIG. 9 illustrating the wavelength characteristic thus viewed of the optical system in FIG. 10, "i" is the illuminating beam of the specimen 8; "j" is the beam in the observed band, i.e., first band, and "k" is the beam in the band for temperature measurement, i.e., second band.

The first band is a shortwave range of 500–540 nm in length and the second band is a longwave range of 1800–2500 nm.

In the optical system illustrated in FIG. 10, the illuminating device consists of a xenon lamp 30 of parabolic mirror type with high brightness as the light source, an infrared absorbing filter 31, a first condenser lens 32 and a first beam splitter 33.

The xenon lamp 30 is one with high brightness and the beam it emits, with the infrared rays eliminated by the filter 31, makes an illuminating beam with the spectral distribution characteristic as indicated by "i" in FIG. 9. This illuminating beam "i", as seen from FIG. 9, contains components of the first band "j" but no components of the second band "k".

This beam "i" has a maximum relative luminous efficiency and high intensity around the wavelength 550 nm.

The first condenser lens 32 serves to converge the beams "i" which have passed through the infrared absorbing filter 31.

The first beam splitter 33 is of such a characteristic that it reflects the beams "i" in the direction of the observed surface 8b of the specimen 8 and it transmits the beams from the specimen 8.

The observing system consists of an objective lens 15, a second beam splitter 34, a corrective lens 35, a first bandpass filter 36, an eyepiece 37 and the first beam splitter 33.

The objective lens 15 paired with the eyepiece 37 serves to magnify the specimen 8 for observation. Since the objective lens 15 is located between the specimen 8 and the beam first splitter 33, it gives the beam "i" to the specimen 8 and receives the beam from the specimen 8, i.e., a mixed beam "l" of the reflection and the heat radiation "h".

The beam splitter 34 reflects a portion of the incident beams of the specimen 8 coming through the first beam splitter 33 after passing through the objective lens 15 and transmits the remaining portions thereof.

The corrective lens 35 and the first bandpass filter 36 are positioned in the reflecting direction of the second beam splitter 34.

The corrective lens 35 compensates for the effect of distance from the eyepiece 37.

The first bandpass filter 36 sets the first band and, as indicated in FIG. 9, it transmits beams in the wavelength range of 500–540 nm, i.e., beams "j" of the first band only; and the eyepiece 37 is located in the transmitting direction of this first bandpass filter 36.

The photographic system consists of a dichroic mirror 38, a second bandpass filter 39, a beam third splitter 40, a photo-lens 41, a photo-film 42, an exposure meter 43, the objective lens 15, and the first and second beam splitters 33 and 34.

The dichoric mirror 38 is situated in the transmitting direction of the second beam splitter 34 and it reflects only the visible beam components while transmitting the infrared components.

The second bandpass filter 39 is situated in the reflecting direction of the dichroic mirror 38 and is characterized so that, just like the first bandpass filter 36, it transmits beams in the range of 500–540 nm, i.e., beams "j" of the first band only.

The a third beam splitter 40 is situated in the transmitting direction of the second bandpass filter 39, and it transmits virtually all incident beams "j" and reflects only a very small part of them.

In the transmitting direction of the third beam splitter 40 are the photo-lens 41 and the photo-film 42, while in the reflecting direction of the third beam splitter 40 is a CdS detector of the exposure meter 43.

In the photographic system only the major parts are shown and others, for instance, the shutter are omitted.

The temperature-measuring system consists of a full-reflecting mirror 44, a focusing lens 45, the infrared radiation pyrometer 23, the objective lens 15, the first and second beam splitters 33, 34 and the dichroic mirror 38.

The full-reflecting mirror 44 is situated in the transmitting direction of the dichroic mirror 38; and it reflects all incident beams composed of only infrared rays passing through the dichroic mirror 38.

The focusing lens 45 is situated in the reflecting direction of the full-reflecting mirror 44, and focuses the reflection from the full-reflecting mirror 45.

The infrared radiation pyrometer 23 is a well-known one which gives a temperature output corresponding to the brightness of the heat radiation beam "h". It is located in the transmitting direction of the focusing lens 45 and is characterized so that it is responsive only to beams of 1800–2500 nm, i.e., beams "k" of the second band. The pyrometer's light-receiving element is a PbS detector. Thus, the second band is set by the light-receiving characteristic of this pyrometer 23. The temperature detected by this pyrometer 23 is indicated by the temperature indicator 46.

Observation, photographing and temperature measurement using the above optical system are executed as follows.

The xenon lamp 30 in the illuminating system is ignited.

The, lamp beam is deprived of the infrared components in its waveform by the infrared absorbing filter 31 and is reformed into an illuminating beam "i" with a spectral distribution characteristic of FIG. 9.

The beam "i" thus devoid of the infrared component is converged by the condenser lens 32, is brought to the first beam splitter 33, and, being reflected by the first beam splitter 33, passes through the objective lens 15 and illuminates the specimen 8.

The specimen 8 is heated to a high temperature; therefore from its observed surface 8b a mixed beam "l" of the reflection from the beam "i" and the heat radiation beam "h" goes into the objective lens 15.

The mixed beam "l" from the specimen 8 goes via the first beam splitter 33, the second beam splitter 34, the dichroic mirror 36 and the full-reflecting mirror 44 respectively into the systems for observation, photographing and temperature measurement.

The beam introduced into the observation system remains a mixed beam "l" until it passes through the corrective lens 35, but after passing through the first bandpass filter 36 it becomes a beam "j" of the first band, which alone goes into the eyepiece 37.

The first bandpass filter 36 has a narrow range of wavelengths 500–540 nm which are wholly fit for observation by human in the part where the brightness of the heat radiation beam "h" is low compared with that of the beam "i" from the xenon lamp, i.e., in the high-brightness part of the xenon lamp beams passing through the filter 31. Accordingly the beam "j" of the first band which has passed through the first bandpass filter 36 becomes a beam of such wavelength characteristic such as illustrated in FIG. 9, which can be observed by an observer.

Also in the photographic system using a second bandpass filter 39 of the first same characteristic as the bandpass filter 36 in the observation system, only the beam "i" of the first band is given via the third beam splitter 40 and the photo-lens 41 to the photo-film 42, and this enables photography the beam.

The beam "j" of the first band given through the beam splitter 40 to the exposure meter 43 is utilized for adjusting exposure during photographing.

The infrared rays introduced into the temperature-measuring system contain, as mentioned above, only the heat radiation beams "h" and go via the focusing lens 45 to the infrared radiation pyrometer 23.

From the brightness of the infrared rays, i.e., heat radiation beam "h" given to the pyrometer 23, the temperature of the specimen 8 can be estimated and this pyrometer is a well-known one which gives a temperature output corresponding to the brightness of 1800–2500 nm components in the infrared rays.

An example of the performances of the second beam splitter 34, the dichroic mirror 38, and the infrared radiation pyrometer 23 follows. When a second beam splitter 34 which transmits 85% of the mixed beams "l" from the specimen 8 and a dichroic mirror 38 which transmits 10% of the infrared rays are employed, 85% of the infrared rays from the specimen 8 will go through the second beam splitter 34. Further 10% of them will go through the dichromatic mirror 38, and thus, 8.5% of the heat radiation beams "h" will go to the infrared radiation pyrometer 23.

If the pyrometer 23 used in one that can detect the temperature of the specimen 8 when 8.5% of the infrared rays therefrom is given to it, the temperature measurement will be accurate.

An infrared radiation pyrometer 23 capable of such a performance is also well-known.

In the optical system thus constituted, when the specimen 8 is exposed to beams "i" with components of the first band no infrared rays, the brightness of the heat radiation beam "h" will be low as compared with that of the reflected beam in the first band.

Thus, with only the components of the first band selected by the systems for observation and photographing, observation and photographing can take place utilizing the beams "j" of the first band. At the same time, in the temperature-measuring system, the infrared radiation pyrometer 23 which is responsive to only the components of the second band in the infrared range containing no reflected beam measures the temperature of the specimen 8 by the beams "k" of the second band.

The above is a rather detailed account of an optical system which is the most desirable embodiment of the present invention, but it is apparent that many other variations of the embodiment are conceivable which are restricted only by the definitions stated in the appended claims.

For instance, whereas in the above embodiment the second band agrees with the responsive band of the pyrometer 23, it would be possible without departing from the technical scope of the present invention to set the second band by means of a bandpass filter so that only the second band components can be given to the pyrometer 23.

Next the specimen holder is to be described.

The specimen-holding tube 9 is equipped, as illustrated in FIG. 13, internally with a hollow movable arm 47.

The movable arm 47 is supported at a position about 1/3 of the way from its tip by a spherical coupling 48 within the tube 9. The forward portion of the tube 9 is sealed by the spherical coupling 48.

Figure 18A:
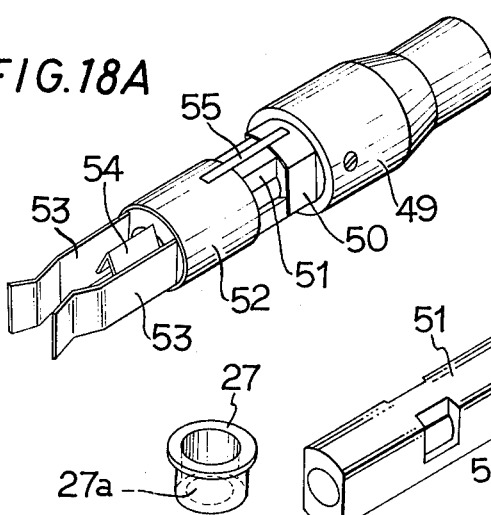
Figure 18B:
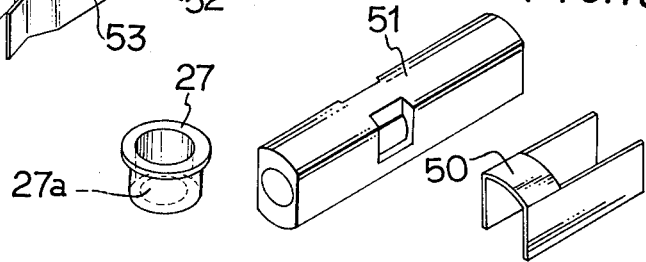

A junction pipe 49 is attached to the tip of the arm 47 and as indicated in FIG. 18A and 18B, a heat-insulation tube 51 of insulating material is inserted therein through a metal fork 50.

The insulating material used is refractory materials, such as ceramics, or metal, such as a thick layer of film such as tungsten, iridium, tantalum and molybdenum.

The heat-insulation tube 51 has an appropriate opening on the side surface near the mid-portion and has a pair of clamp plates 53 fitted around the tip by a thin-walled pipe 52 of a metal with a high melting point and a chevron piece 54 is attached between the clamp plates 53.

The metal fork 50 and the thin-walled pipe 52 are electrically connected by a lead plate 55.

The specimen dish 27 has its sides squeezed between the pair of clamp plates 53 whose tips are bent inward and then bent back outward. The flanged edge of the specimen is supported so that a force acts in the central direction of the movable arm 47, and this force is borne by the chevron piece 54 near the center of the dish 27. Thus, the dish 27 is freely dismountable by a three-point contact.

As shown in FIGS. 3 and 4, the specimen 8 is placed on the specimen seat 28 inserted in the specimen dish 27 and its top is clamped with a ring spring 29.

Figure 16:
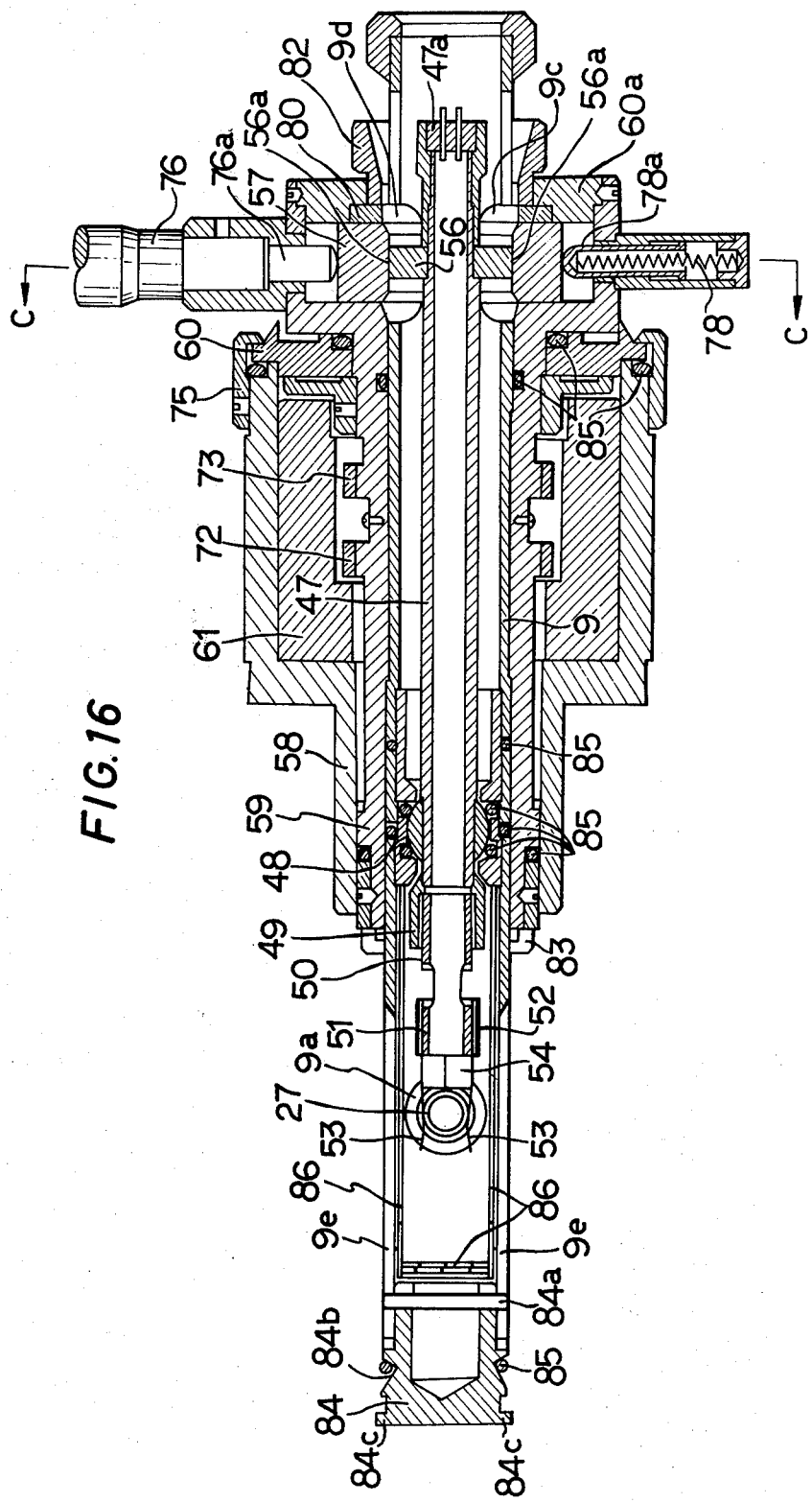
Figure 17:
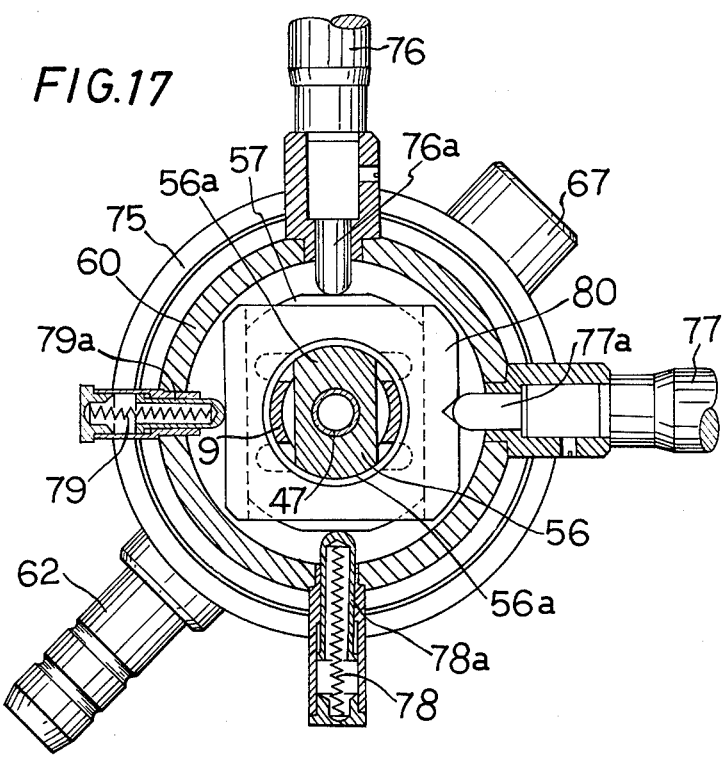

The rear end (atmospheric side) of the movable arm 47 is sealed by a sealing piece 47a, and toward the center thereof, as indicated in FIGS. 13, 16 and 17, a disk 56 is fitted which has both ends notched and has approximately the same diameter as the specimen-holding tube 9.

The specimen-holding tube 9 is provided, as shown in FIGS. 13 and 17, with an electron beam inlet 9a above the specimen dish 27 and with an observation hole 9b below the specimen dish 27. On both sides of the fixture of the disk 56 are openings 9c and 9d, and the periphery 56a of the disk 56 is exposed outward at the openings 9c, 9d.

The periphery 56a of the disk 56, when the specimen-holding tube 9 is attached to the vacuum tank 1, is held by the slide plate 57 through the openings 9c, 9d.

The pre-exhaustion chamber 10 shown in FIGS. 1, 11 and 12 has its tip, which goes into the tank 1, formed as a hollow cylinder in the space bounded, as shown in FIGS. 13 to 16, by a sealed outer cylinder 58 and an inner cylinder 59. Its other end is tightly sealed with a transverse lid 60.

Within the pre-exhaustion chamber 10 a spacer 61 is installed to reduce the inner volume of the chamber.

Figure 14:
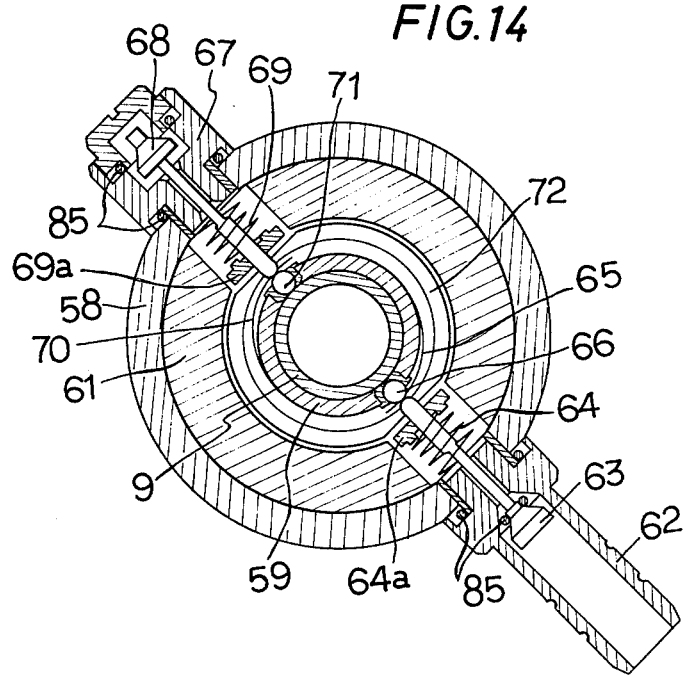

As shown in FIG. 14, through the outer cylinder 58 of the pre-exhaustion chamber 10, a pre-exhaust pipe 62 is installed which withdraws the air of the chamber by an exhaust pump (not shown) when an exhaust valve 63 is opened in the pipe 62.

The exhaust valve 63 is conical with a slidable rod at the tip and is normally pressed toward the center of the cylinder 59 and closed by a spring 64.

Within the inner cylinder 59 of the chamber 10 there is a steel ball 66 pressed centrally inwardly by a leaf spring 65 and is supported rotatably and projectably into and out of the inner cylinder 59.

The slidable rod at the tip of the exhaust valve 63 is brought continuously into contact with the steel ball 66 through the leaf spring 65. The exhaust valve 63 is opened when the steel ball 66 is displaced outwardly, overcoming the pressure of the leaf spring 65 and the spring 64.

When the specimen-hold tube 9 goes into the pre-exhaustion chamber 10, the steel ball 66 fits into a pair of guide slots 9e provided on the specimen-holding tube 9, as indicated in FIG. 11. The guide slots 9e terminate as an included surface extending up to the outside diameter of the specimen-hold tube 9.

Thus, the steel ball 66 moves outward to open the exhaust valve 63, when it reaches the end of guide slots 9e with the progress of the insertion of the specimen-holding tube 9 into the chamber 18. In axisymmetry to the pre-exhausting pipe 62 is, as shown in FIG. 14, a heated guide cylinder 67 with a similar composition of a guide rod 68, a spring 69 a leaf spring 70 and a steel ball 71, which balances with the pre-exhausting pipe 62, and thereby ensures the central position of the specimen-hold tube 9 in the inner cylinder 59.

The specimen observation angle is variable by turning the inner cylinder 59.

As the inner cylinder 59 is turned from a given position, the steel ball 66 moves together with it and causes the exhaust valve 63 and the tip of the guide rod 68 to come off the steel balls 66, 71.

The rings 72 and 73 provided around the inner cylinder 59 are of such outer diameter that they come into contact with both ends of the spring bearings 64a 69a fitted near the slidable end of the guide rod 68 and the exhaust valve 63, and thereby hold the exhaust valve 63 and the guide rod 68 open.

A part of the rings 72, 73, i.e., the periphery of the rings 72, 73 on the side of the spring bearings 64a, 69a when the inner cylinder 59 is at a specific position, is notched.

Thus, when the inner cylinder 59 is at a specific position without being turned, the spring bears 64a, 69a are not in contact with the rings 72, 73; and the exhaust valve 63 and the guide rod 68 are opened or closed only in response to the displacement of the steel balls 66, 71.

A slip ring 74 smooths the turning of the inner cylinder 59; and 75 is a srew ring.

Behind the pre-exhaustion chamber 10 in the inner cylinder 59 are micrometers 76, 77 fitted in position vertical to the axis of the specimen-holding tube 9 for fine adjustment of the specimen position in the dish 27. Also, provided are return springs 78, 79 in the micrometers. The tips of the rods 76a, 77a, 78a, 79a in the micrometers 76, 77 and said return spring 78, 79 are in contact with the disk 56 through the slide plates 57, 80, and the specimen-holding tube 9 can go in or out through the slide plates 57, 80.

The first micrometer 76 and its return spring 78, and the second micrometer 77 and its return spring 79 are respectively paired to shift the movable arm 47f in the directions of the Y-azis and the Z-axis.

Thus, the movable arm 47 is rotatable around the spherical coupling 48. Theoretically the specimen position in the dish 27 is changeable in arc fashion, but the angle being slight, the change may be deemed straight.

The X-axial shift of the movable arm 47 takes place linearly by means of a third micrometer 81 and the rod 81a (FIG. 1) fitted on the opposed surface to the inserted specimen-holding tube 9 in the tank 1, and the specimen 8 in the dish 27 is shifted linearly.

The slide plates 57 80 are, as indicated in FIGS. 13, 16 and 17, located slidably in the diametral direction of the specimen-holding tube 9 between the vertical part of the inner cylinder 59 and a transverse lid 60a.

The transverse lid 60a consists of a disk having a concentric hole at the center and a stepped part which slidingly squeezes both sides of the slide plate 80.

The slide plate 57 has its top and bottom slidably held in the bend of the slide plate 80. Therefore, the slide plate 80 can slide vertically in the stepped part of the transverse lid 60a, internally holding the slide plate 57, and the slide plate 57 is fitted to be horizontally slidable within the slide plate 80.

On the inside of the transverse lid 60a is screwed a lock knob 82 which is movable in the longitudinal direction. When the lock knob 82 moves forward and its tip presses the slide plate 80, the slide plates 57, 80 are locked; the movable arm 47 is fixed through the disk 56; and the specimen position is fixed in the dish 27.

Between the tips of the outer cylinder 58 and the inner cylinder 59 which go into the tank 1 there is a cylindrical plug bearing 83 as illustrated in FIGS. 13 and 16. One end of the plug bearing 83 is formed as a narrow portion with the same diameter as the inner diameter of the inner cylinder 59; the narrow portion is axisymmetrically notched at two places; and the remaining portion of it constitutes a pair of hook bearings 83a at the, top and bottom.

Between the hook bearing 83a and the tip of the inner cylinder 59 is an annular groove 83b.

An airlock plug 84 consists of a large-diameter part closely fitting the inner cylinder 59 and a small-diameter part closely fitting the specimen-hold tube 9. The large-diameter part has an inclined groove 84b, and at the bottom of the groove is a heat-resistant O-ring packing 85.

The small-diameter part has a spring pin 84a which fits into a pair of guide slots 9e provided on both sides of the specimen-holding tube 9, whereby the airlock plug 84 can go into the specimen-holding tube 9 always at the same angle.

As indicated in FIG. 11, the guide slots 9e have a circular hole 9f at the position of the spring pin 84a when the plug 84 is perfectly in position, and thus, the spring pin 84a is held in this hole 9f.

At the tip of the large-diameter part of the airlock plug 84 is a hook 84c which is locked by engaging the plug bearing 83.

The hook 84c is of the same diameter as the annular groove 83b of the plug bearing 83 and has its top and bottom trimmed to the same width as the notched part of the hook bearing 83a.

Therefore, when the airlock plug 84 is inserted into the inner cylinder 59 and the specimen-holding tube 9 at such a horizontal angle that the hook 84c that it can pass the notched part of the plug bearing 83 and then it is turned, the hook 84c will be locked in the annular groove 83b by the hook bearing 83a.

Figure 15:
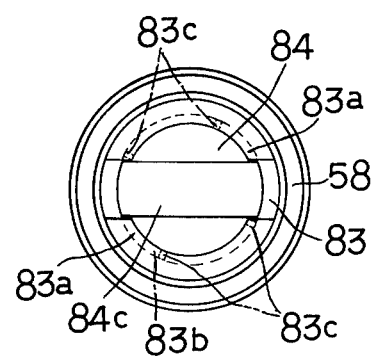

In the annular groove 83b, as indicated in FIG. 15, stoppers 83c are provided at the extreme right of the hook bearing 83a on the top side as viewed from the inserted direction of the specimen-holding tube 9, at 45° clockwise from extreme left of it, and at axisymmetric positions of the hook bearing 83a on the bottom side.

Thus, the airlock plug 84 can be locked by turning 45° clockwise from the horizontal position and unlocked by turning 45° counterclockwise from that position.

In all the Figures, 85 denotes on O-ring packing and 86 denotes a reflecting cylinder for heat insulation which is additionally attached to the inside of the specimen-holding tube 9.

Next, use of the specimen holder thus constituted is to be described.

The specimen dish 27 can go in and out of the specimen-holding tube 9 through the electron beam inlet 9a provided therein.

This can be done easily by holding the dish 27 in a pincette.

The specimen dish 27 is set in position by being held between a pair of clamp plates 53, right and left, and a chevron piece 54. It can be easily disengaged from the clamp plates 53 by lifting it upward.

Insertion of the specimen-holding tube 9 into the vacuum tank 1 takes place as follows.

(A) As indicated in FIG. 11, the specimen-holding tube 9 is pushed into the inner cylinder 59 from a horizontal position at a clockwise inclination of 45° and isset in position. Thus the ends of the steel balls 66, 71 and the spring pin 84a of the airlock plug 84 can fit into the guide slot 9e.

If an angle other than this is taken the specimen-holding tube 9 will be blocked by the spring pin 84a and will not go in.

As illustrated in FIGS. 12, 13 and 16, the specimen-holding tube 9 is pushed in until the air lock plug 84 completely fits into its tip.

(B) In the state indicated in FIG. 12, the forward portion of the specimen-holding tube 9 communicates with the pre-exhaustion chamber 10 via the electron beam inlet 9a, the observation hole 9b and the guide slot 9e, while the steel balls 66 71 are at the end of the guide slot 9e and move out of the inner cylinder 59.

Thereupon the exhaust valve 63 opens to make preexhaustion of the specimen-holding tube 9.

(C) When the pre-exhaustion is finished (usually it takes about 10 seconds), as indicated in FIGS. 13 to 15 the specimen-hold tube 9 is turned 45° counterclockwise thus, restoring the original horizontal position.

In the state indicated by FIGS. 13 to 15, the steel balls 66, 71 are out of the guide slot 9e and remain around the specimen-holding tube 9 which is 45° away from the guide slot 9e; therefore the exhaust valve 63 remains open and accordingly, the pre-exhaustion continues.

Meanwhile, the plug 84, being engaged by the spring pin 84a fitting into the circular hole 9f of the guide slot 9e, turns 45° counterclockwise with a turning of the specimen-holding tube 9. As the plug 84 turns, the plug 84 and the plug bearing 83 are unlocked.

(D) Next, when as indicated in FIG. 16 the specimen-holding tube 9 is pushed in until the tip of the airlock plug 84 fitting into the top of the tube 9 comes into contact with the tip of the rod 81a of the micrometer 81, insertion of the tube 9 is completed.

Even then the steel balls 66, 71 still remain around the specimen-holding tube 9; therefore with the exhaust valve 63 being held open, pre-exhaustion continues.

In any of the above steps (A) to (D), the tank 1 is isolated from the outside by means of the O-ring packing provided midway in the specimen-holding tube 9.

In the steps (B) to (D) pre-exhaustion continues in the chamber 10 while the tube 9 is being inserted; thus the degree of vacuum in the tank 1 does not drop.

The position of the specimen 8 to be observed after insertion of the tube 9 into the tank 1 is adjustable in the direction of the X-axis, Y-axis and Z-axis, respectively, by the micrometers 81, 76 and 77. The observed angle is variable by turning the inner cylinder 59 and thereby tilting the specimen 8.

The specimen-holding tube 9 can be taken out of the tank 1 by reversing to the insertion procedure.

In the above example a known means is used to support the tank 1 and the optical shystem housing 14 and it is not shown.

For exhausting the tank 1 and pre-exhausting the chamber 10, a known means is also used and it is not shown here.

As for the electron beam control, only its block diagram is illustrated; its housing is also a well-known means and it is omitted.

Devices in the inert gas introducing system such as the gas cylinder, open/close valve and pressure regulater to be installed outside of the tank 1 are also known means, and accordingly, they are omitted.

Devices in the optical system such as the power source for illumination, flasher and ignition circuit are also well-known means and are omitted.

The mechanism to move the optical system vertically for focus adjustment in observation is also a known means and is omitted.

The high-temperature microscope according to the present invention, which is thus constituted and heats the specimen by an electron gun, has many advantages over the conventional one which heats the specimen in a radiation heating furnace.

Since the specimen itself is directly heated by electron beam, the heat transfer is fast and the heat response is quick. Thus, the temperature control can be swift, easy and reliable.

Since the refractory materials are utilized only for the purpose of holding the specimen, heat consumption is little.

The specimen holder holds the specimen merely at an angle toward the radiating direction of the electron beam and the observed direction. Accordingly, this mechanism is simple; it can quite easily go in and out of the tank; and no trouble is involved when the specimens are exchanged.

Thus, the heat capacity of the specimen and the specimen holder being small, the heat response in heating the specimen is further improved.

In the meantime, only the specimen is directly heated by electron beam radiation and the refractory materials holding the specimen are heated by heat transfer from a heated specimen; accordingly, the temperature of the refractory materials cannot be higher than the temperature of the specimen.

It is thus possible to heat the specimen to a higher temperature than the temperature which the refractory materials can withstand and with the heating temperature of the specimen less restricted by the temperature which the refractory materials can withstand, heating can be done to a higher temperature than in the conventional microscope, i.e., over 2500° C.

Because of only the specimen is directly heated and the refractory materials are not being directly heated, and the consumption of the refractory material is low, vaporation of the refractory materials is little, even when the specimen is heated to a high temperature. Accordingly, the specimen is less contaminated with the vapor.

Furthermore, electron beams can be focused and deflected to just the necessary extent and accordingly, a variety of heatings can be executed, such as localized heating of the specimen with a minimum area of radiation, or linear heating of the specimen by a linear scanning of finely focused electron beams. Thus a variety of observations and photography can be done under different heated conditions of the specimen.

Also, since the specimen temperature can be controlled to a preset value by changing the electron beam radiation, it is possible to heat the specimen to a desired temperature and observe its state at that temperature.

Moreover, near the observed surface of the specimen, a local pressurized atmosphere of inert gas is formed, while at the same time inert gas diffuses within the vacuum tank to form a gas curtain between the specimen and the observation window. Thus, vapor generation from the specimen and the refractory materials at high temperature are suppressed, while a generated vapor is dispersed together with the movement of the gas curtain, thereby preventing the observation window from clouding.

This is an improvement over the conventional microscope which is designed so that a clear rotatable window is provided at right angles to the observed direction between the specimen and the observation window, and wherein the vapors are is deposited by condensation onto the area between the specimen and the observation window. Every time the glass is clouded with such a deposition, the window is successively rotated to show a clear area. Under such a design, however, the number of frames changeable in one window is limited and such a window is unfit for long hours of continuous observation or photography.

In contrast, a microscope according to the present invention, which is free from the above drawback, is fit for long hours of continuous observation of photography. When coupled with the conventional method as illustrated in the above example, it will be more effective to prevent cloudiness.

Further, when inert gas is introduced according to the present invention, it will be possible to cool the specimen with gas and provide a gas etching on the observed surface of the specimen.

Furthermore, according to the present invention, as described above, the specimen is radiated with beams of visible range containing a low-brightness band of heat radiation from the specimen and it is observed or photographed under beams of this band. Therefore the brightness of the heat radiation beam is relatively low and there is little likelihood of an adverse effect from infiltration of the heat radiation beam.

Thus, with the contrast of the specimen intensified, a distinct image can be obtained in observation and photography.

Notably, the brightness of the heat radiation beam increases with a rise in the specimen temperature, but by selecting a band with a low increase of brightness for observation and photography, the contrast of the specimen image under high temperature is so strong that even under high temperature (at which only a blurred image of the specimen could previously be obtained) observation or photography of the specimen can be done successfully, yielding a distinct image.

Meanwhile, for temperature measurement, a band containing heat radiation beams is selected, while beams not containing beams of this band are employed to illuminate the specimen, thereby separating the reflection beam from the heat radiation beam. Thus, temperature measurement using only pure heat radiation beams is achieved.

Therefore, in temperature measurement the result is extremely accurate; the response is quick; and since the heat radiation beams are exclusively those originating from the observed surface of the specimen, the temperature of the observed part itself can be measured. Even when the observed position is moved or the observed scope is changed, correspondingly only the temperature of the part under observation can be measured.

Moreover, since the temperature measurement takes place through no contact with the specimen, unlike in the measurement with contact thereof, the measurement can be done accurately and easily with no heat transfer to or from the specimen. Besides handling is simple without any complicated operation needed.

When the arrangement is such as defined in claim 3, the fringe of the radiated area of the specimen is more intensely heated than the center of it. With the heat loss to the ambient area thus compensated, the radiated area as a whole can have a uniform temperature distribution.

When the arrangement is such as defined in claim 4, the specimen heating temperature is controllable to a single preset value or to a plurality of programmed values. Then, observation or photography can be done while the temperature of the specimen is constant or changing.

When the arrangement is such as defined in claim 5, the following effects can be gained.

The specimen held in a specimen-holding tube with a small capacity is inserted into the tank and the tank is maintained under a vacuum. Therefore, as soon as the specimen is set in position, observation can be started in a vacuum condition with waiting, thus increasing efficiency.

Since the tank is all the time sealed from to the atmosphere, the specimen is not likely to be contaminated with atmospheric impurities.

Since the specimen is placed in a dish and the dish is dismountably held in the specimen-holding tube, the specimen can be readily exchanged.

Moreover, since the specimen-holding tube are interchangeable, a number of tubes can be made available each with a specimen set therein, cutting down on the time needed for specimen exchange. Also, by using a special tube equipped with test devices for tension or compression, abundant data can be collected with ease.

When the arrangement is such as defined in claim 6, a gas curtain is reliably formed between the specimen and the observation window; and for this purpose the mechanism is simple; gas consumption is little; and with the inert gas inlet structurally separated from the specimen holder, the specimen can be freely set into position or removed.

When the arrangement is such as defined in claim 7, observation takes place in a band with little infiltration of heat radiation beams; temperature measurement takes place in a band with high brightness of heat radiation beams, thus enhancing the accuracy of observation and temperature measurement; and with the structural parts simplified, the whole mechanism can be simplified. Particularly when the arrangement is such as defined in claim 9, experiments show that good results can be obtained.

When the arrangement is such as defined in claim 8, the beams from the specimen are split by the beam splitter and the dichroic mirror and using these beams, observation, photography and temperature measurement of the specimen can be conveniently executed at the same time. Thus, even when the specimen temperature changes suddenly, data can be collected at the desired moment with no time delay.

As elaborated above, the high-temperature microscope according to the present invention can give a number of excellent effects unavailable from the conventional one.

What is claimed is:

1. A high-temperature microscope comprising:
   (a) a vacuum tank consisting of a sealed chamber having an observation window;
   (b) an exhauster to evacuate said tank;
   (c) an electron gun to emit electron beams to heat a specimen, said gun being located in said tank;
   (d) electron beam control means for regulating the radiation intensity and diameter of said electron beams emitted by said electron gun;
   (e) specimen holder means for holding said specimen such that a first side of said specimen faces the beam radiation direction, while a second side of said specimen faces said observation window;
   (f) inert gas inlet means to introduce inert gas and form an inert gas curtain between said specimen and said observation window;
   (g) illumination means to illuminate the observed area of said specimen with beams containing short wave components of a first band and no long wave components of a second band, said first band being located in the visible range in which heat radiation beams have low brightness, and said second band including heat radiation beams and being separate from said first band;
   (h) an observation system and a photographic system including means for introducing therein only components of said first band in beams reflected from said observed area of said specimen; and
   (i) a temperature-measuring system operatively connected to said electron beam control means and including means for introducing therein only components of said second band in beams radiated from said observed area of said specimen.

2. A high-temperature microscope as claimed in claim 1, wherein said electron gun includes a cathode, a wehnelt and an anode.

3. A high-temperature microscope as claimed in claim 1, wherein said electron gun includes means for emitting beams having a radiation distribution which is sparse at the center of the beam and dense at the fringe of the beam.

4. A high-temperature microscope as claimed in claim 1, further comprising:
   means for supplying the temperature detected by said temperature-measuring system to said electron beam control means;
   means for defining a preset specimen heating temperature;
   means for adjusting the radiation intensity of beams emitted by said electron gun such that, upon a comparison between said temperature detected by said temperaturemeasuring system and said preset specimen heating temperature, said detected temperature is adjusted to agree with said preset temperature;
   means for focusing said electron beams and means for deflecting said electron beams, said focusing and deflecting means being disposed along the path of said electron beams.

5. A high-temperature microscope as claimed in claim 1, wherein said specimen holder means comprises a specimen-hold tube mounted for movement into and out of said vacuum tank without disturbing the vacuum therein, a specimen-hold mechanism formed at the forward portion of said specimen-hold tube, and a specimen dish detachable mounted on said specimen-hold mechanism, said dish having a partial opening in the bottom thereof.

6. A high-temperature microscope as claimed in claim 5, wherein said inert gas inlet comprises a nozzle extending between said observation window and said specimen-hold tube.

7. A high-temperature microscope as claimed in claim 1, wherein said first band is in the visible range and said second band is in the infrared range.

8. A high-temperature microscope as claimed in claim 7, wherein said illumination means comprises a xenon lamp light source, an infrared absorbing filter to filter the components of said first band from the beams of said xenon lamp and absorb the components of said second band, and a first beam splitter to reflect the beams from said filter in the specimen observing direction and transmit the beams from the observed area of said specimen; said observation system comprises an objective lens located between said first beam splitter and said specimen, a second beam splitter located in the direction of the beams from said specimen which have passed through said objective lens passing through said first beam splitter, a first bandpass filter located in the reflecting direction of said second beam splitter and transmitting only the components of said first band, an eyepiece and said first beam splitter; said photographic system comprises a dichroic mirror located in the direction of the beams from said first beam splitter passing through said second beam splitter for the purpose of transmitting only infrared components and reflecting other components, a second bandpass filter located in the reflecting direction of said dichroic mirror for the purpose of transmitting only the components of said first band, a third beam splitter located in the transmitting direction of said second bandpass filter for the purpose of reflecting a part of beams transmitted thereby and of passing the remainder of such beams, an exposure meter located in the reflecting direction of said third beam splitter, a photo-lens located in the transmitting direction of said third beam splitter, said objective lens, said first beam splitter and said second beam splitter; and said temperature-measuring system comprises a full-reflecting mirror located in the direction of the beams from said second beam splitter passing through said dichroic mirror, a focusing lens located in the reflecting direction of said full-reflecting mirror, an infrared radiation pyrometer exclusively responsive to the components of said second band, said objective lens, said first beam splitter, said second beam splitter and said dichroic mirror.

9. A high-temperature microscope as claimed in claim 1, wherein said first band has a wavelength in the range of 500–540 nm, and said second band has a wavelength in the range of 1800–2500 nm.

* * * * *

UNITED STATES PATENT AND TRADEMARK OFFICE
CERTIFICATE OF CORRECTION

PATENT NO. : 4,186,305
DATED : January 29, 1980
INVENTOR(S) : TAOKA ET AL

It is certified that error appears in the above-identified patent and that said Letters Patent are hereby corrected as shown below:

On the first page of the patent containing the inventors' names, please make the following changes:

in line 4, after the first inventor's name, change the place of residence from" Masashino" to --Musashino--;

in line 5, correct the spelling of the third-listed inventor from "Hisashki Kawamura" to --Hisashi Kawamura--; and in line 7, correct the spelling of "Chafu" to --Chofu--.

Signed and Sealed this

Third Day of June 1980

[SEAL]

Attest:

SIDNEY A. DIAMOND

Attesting Officer

Commissioner of Patents and Trademarks